US012638490B2

(12) United States Patent
Wagner et al.

(10) Patent No.: US 12,638,490 B2
(45) Date of Patent: *May 26, 2026

(54) INTEGRATED INSULATION INSPECTION SYSTEM INCLUDING INSULATION INSPECTION STAND WITH CONDUCTIVE BRUSHES

(71) Applicant: GM GLOBAL TECHNOLOGY OPERATIONS LLC, Detroit, MI (US)

(72) Inventors: Sean Robert Wagner, Shelby Township, MI (US); John S. Agapiou, Rochester Hills, MI (US); Bradley Allen Newcomb, Troy, MI (US); Erik Brandon Golm, Sterling Heights, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 130 days.

This patent is subject to a terminal disclaimer.

(21) Appl. No.: 18/428,643

(22) Filed: Jan. 31, 2024

(65) Prior Publication Data

US 2025/0244377 A1      Jul. 31, 2025

(51) Int. Cl.
 *G01R 31/12*       (2020.01)
 *G01R 1/073*       (2006.01)
 *G01R 31/34*       (2020.01)

(52) U.S. Cl.
 CPC ..... *G01R 31/1272* (2013.01); *G01R 1/07357* (2013.01); *G01R 31/346* (2013.01)

(58) Field of Classification Search
 CPC ........... G01R 31/1272; G01R 1/07357; G01R 31/346; G01R 31/1263; G01R 31/34; G01R 31/52
 See application file for complete search history.

(56) References Cited

U.S. PATENT DOCUMENTS

| | | | |
|---|---|---|---|
| 5,514,967 A | 5/1996 | Zelm | |
| 6,806,719 B2 | 10/2004 | Awaji | |
| 7,034,706 B1* | 4/2006 | Nippes | G01R 31/343 |
| | | | 340/635 |

(Continued)

FOREIGN PATENT DOCUMENTS

DE      102014107025 A1      12/2014

OTHER PUBLICATIONS

German Office Action from counterpart DE1020241075953, dated Dec. 16, 2024.

(Continued)

*Primary Examiner* — Akm Zakaria

(57) ABSTRACT

An insulation inspection system includes: a support for a part being inspected; brushes including respective sets of conductive bristles, where the sets of conductive bristles brush against respective insulated portions of the part; at least one motor configured to at least one of i) move the part relative to the brushes, and ii) one or more of the brushes relative to the part; and a control module configured to i) control the at least one motor to follow a movement profile, and ii) during movement of at least one of the part and the one or more of the brushes, detect a defect in insulative material of the part due to a short circuit between one or more of the conductive bristles of the brushes and an exposed conductive element of the part in a location of the defect.

20 Claims, 10 Drawing Sheets

(56) References Cited

U.S. PATENT DOCUMENTS

| | | | |
|---|---|---|---|
| 7,042,229 B2 | 5/2006 | Lee et al. | |
| 8,354,817 B2 | 1/2013 | Yeh et al. | |
| 9,018,881 B2 | 4/2015 | Mao et al. | |
| 9,476,944 B2 | 10/2016 | Perry et al. | |
| 10,132,854 B2 | 11/2018 | Dang | |
| 11,569,712 B2 * | 1/2023 | Mukherjee | H02P 9/02 |
| 2012/0206162 A1 | 8/2012 | Leonov | |
| 2014/0368233 A1 | 12/2014 | Perry et al. | |
| 2018/0088168 A1 * | 3/2018 | Dang | H02K 3/30 |

OTHER PUBLICATIONS

German Office Action from counterpart DE1020241090952, dated Feb. 6, 2025.
"Flexible Brush Handle Design for Insulation Inspection," disclosed anonymously, Questel Research Disclosure, The Industry Standard Disclosure Publication Service, www.researchdisclosure.com, published digitally Mar. 23, 2023.

* cited by examiner

INTEGRATED INSULATION INSPECTION SYSTEM INCLUDING INSULATION INSPECTION STAND WITH CONDUCTIVE BRUSHES

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to continuity testing systems, and more particularly, to insulation inspection systems for inspecting stator windings and other electrical components.

Electric vehicles and hybrid vehicles include traction motors for propulsion purposes. Each of the traction motors includes a stator and a rotor having corresponding windings and conductive bars. The windings and/or conductive bars may be insulated (e.g., have an outer insulative coating). During manufacturing, including part and component formation and assembly, the insulative coatings may not be formed properly or may be nicked, scratched, rubbed, etc. This can result in portions of the insulative coatings being absent and/or removed thereby exposing electrically conductive elements. This exposure can result in a short circuit, affect motor performance, and/or reduce life of the motor.

SUMMARY

An insulation inspection system is disclosed and includes: a support for a part being inspected; brushes including respective sets of conductive bristles, where the sets of conductive bristles brush against respective insulated portions of the part; at least one motor configured to at least one of i) move the part relative to the brushes, and ii) one or more of the brushes relative to the part; and a control module configured to i) control the at least one motor to follow a movement profile, and ii) during movement of at least one of the part and the one or more of the brushes, detect a defect in insulative material of the part due to a short circuit between one or more of the conductive bristles of the brushes and an exposed conductive element of the part in a location of the defect.

In other features, the insulation inspection system further includes a frame, where: the support for the part is mounted on the frame; and the at least one motor is directly or indirectly mounted on the frame.

In other features, the support for the part is implemented as a rotary support plate configured to rotate the part relative to the brushes.

In other features, the frame includes rails; the brushes are mounted on the rails via brush holders; and the brush holders are moveable relative to the rails.

In other features, the at least one motor is configured to move at least one of the brush holders along at least one of the rails.

In other features, the rails include a first rail and a second rail. The first rail is mounted to a clamp and supports at least one of the brushes. The clamp is mounted to and slidable along the second rail. A portion of the clamp is rotatable relative to the second rail to transition the at least one of the brushes between a stowed state and a deployed state.

In other features, the at least one motor is configured to move the clamp relative to the second rail.

In other features, the at least one motor includes a motor to move at least one of the brushes between a deployed state and a stowed state. The at least one of the brushes contacts the part when in the deployed state and not contacting the part when in the stowed state.

In other features, the brushes includes at least one straight brush, at least one gamma brush, and at least one 'U'-shaped brush.

In other features, the part is a stator; and the brushes are configured to brush multiple sides of a crown end and a welded end of the stator.

In other features, the control module is configured to rotate the part via the at least one motor while not interfering with a bus bar of the part.

In other features, the at least one motor is configured to move the part relative to the brushes.

In other features, the at least one motor is configured to move one or more of the brushes relative to the part.

In other features, the conductive bristles of at least one of the brushes include an end embedded in epoxy and held together by a conductive crimp layer. The end of the conductive bristles are connected to a wire via a conductive strip that is folded over the conductive crimp layer. The wire provides a signal to the control module. The control module is configured to determine whether a defect exists with the part based on the signal.

In other features, the epoxy includes at least one additive for at least one of increased viscosity and increased conductivity.

In other features, the insulation inspection system further includes a frame, where the brushes are mounted on and movable relative to the frame to accommodate for different sized parts being inspected.

In other features, the brushes include a 'U'-shaped brush including: a first brush brushing a first side of a portion of the part; a second brush brushing a second side of the portion of the part; a third brush brushing a third side of the portion of the part; a first brush holder holding the first brush; a second brush holder holding the second brush; and a third brush holder holding the third brush, where the first brush holder, the second brush holder, and the third brush holder are connected to each other.

In other features, an insulation inspection system is disclosed and includes: a frame; a rotary support table configured to support and rotate a part being inspected; brushes including respective sets of conductive bristles, where the sets of conductive bristles brush against respective insulated portions of the part; motors; and a control module configured to i) control the motors to rotate the part and to move at least one of the brushes relative to the part, and ii) during rotation of the part, detect a defect in insulative material of the part due to a short circuit between one or more of the conductive bristles of the brushes and an exposed conductive element of the part in a location of the defect.

In other features, the brushes include straight brushes and 'U'-shaped brushes.

In other features, the brushes are configured to brush sides of a first portion of the part and sides of a second portion of the part. The second portion is different than the first portion.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

During manufacturing, motors may be inspected to detect defects such as defects in insulative coatings of electrical elements of a stator. The insulative coatings may be visually inspected. This may include a quality control technician using a magnifying glass to visually inspect for defects in the insulative coatings of the stator. Such an inspection is labor intensive and is subject to limitations of the technician. A continuity tester may be used that applies a voltage to the stator and detects when a short circuit exists. Electrical current flows between the stator and the continuity tester when there is a lack of insulative material at the point where the tester contacts the stator.

The continuity tester may include a brush that includes conductive bristles. The bristles may be moved across and brush various portions of the stator to detect short circuit locations (i.e., defect locations) where there is a lack of insulative material. The opposite may also occur where the part (or stator) is moved through the bristles and the brush is stationary. A circuit is used to monitor changes in a voltage at the brush. The voltage drops off substantially when a short circuit occurs. There are large swings in voltage and current between when no short exists and when a short does exist.

Large voltage and current swings in the circuit can be detrimental to components over time if not managed properly. Thus, the components can degrade over time and as a result this degradation can negatively affect operation of the circuit. For example, an A/D converter may have specific voltage and current restrictions for operation based on what is used. If there is any resulting drift in circuit components such as in resistors or other circuit components, this can result in voltage response behaviors that can cause issues with voltage threshold setting and not appropriately detecting a short. The degradation of the circuit components can cause drift in the voltage, which can result in subsequent defects going undetected. The drift thus requires circuit adjustments and periodic recalibrating including adjustments in a threshold value. A defect may be detected when the voltage drops below the threshold value. As an example, the threshold value may be set at 5 volts (V), which is significantly lower than a nominal and/or normally expected voltage (e.g., 24V). The threshold value may be set at less than or equal to 20% of the nominal voltage.

The drift can also result in unsafe current levels. If circuit components degrade over time and a resulting change in expected current of the circuit occurs, this can lead to current levels in the circuit that can exceed a threshold for perceived and/or actual bodily harm. In addition, higher than expected current levels can also be detrimental to parts and the brush even when human exposure is mitigated.

Figure 2:
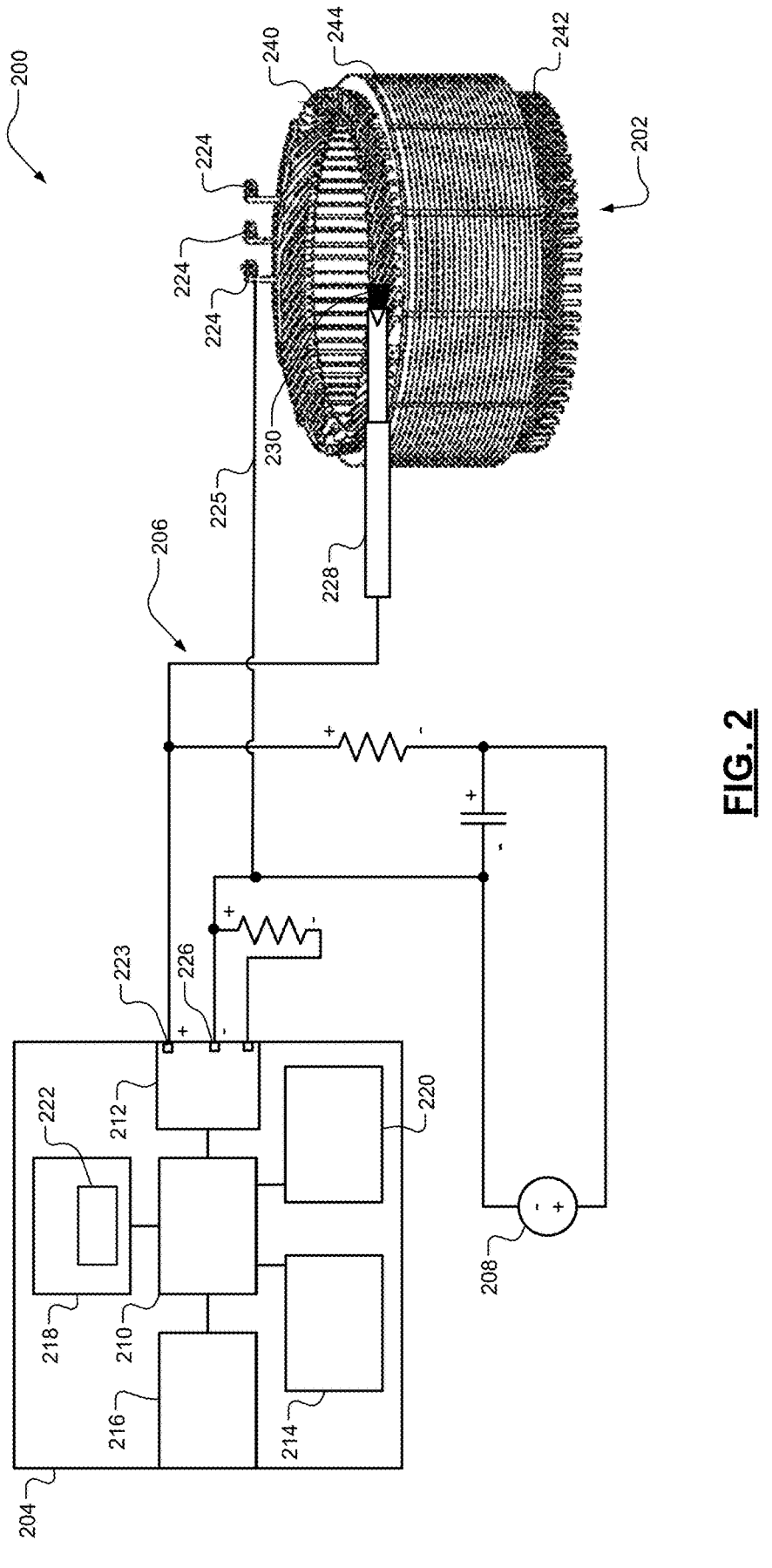
FIG. 2 is a schematic view of an example insulation inspection system inspecting a stator and including a voltage and current balancing circuit in accordance with the present disclosure.
Figure 7:
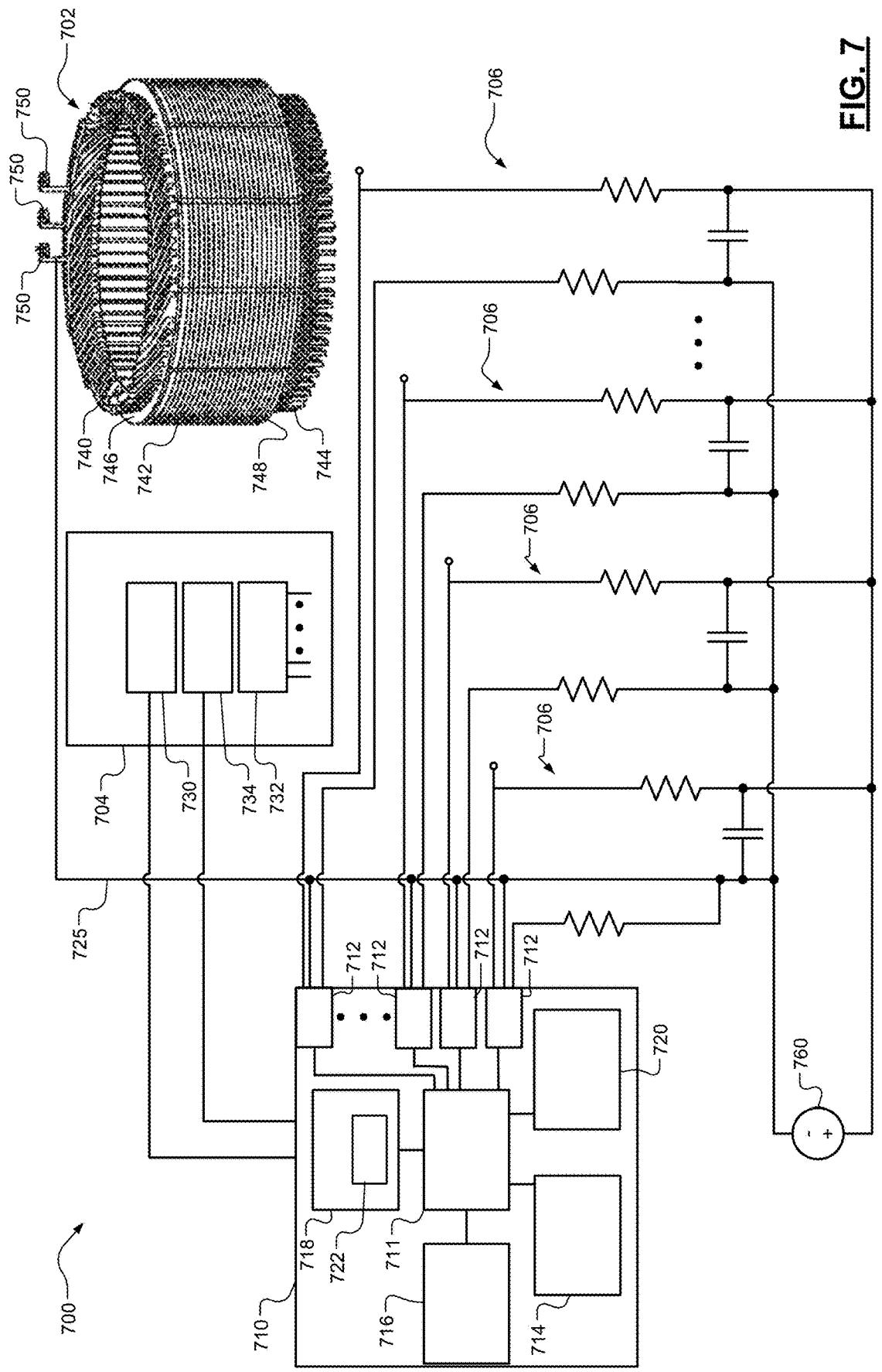
FIG. 7 is a schematic diagram of an example insulation inspection system testing a stator in accordance with the present disclosure.

The examples set forth herein include insulation inspection system that includes i) a part insulation inspection stand having one or more continuity testing brushes (referred to herein as brushes), and ii) one or more corresponding voltage and current balancing circuits, as shown in FIGS. 2 and 7. The brushes are mounted on the part insulation inspection stand along with the part being inspected. The part is moved relative to the one or more brushes or the brushes are moved relative to the part, such that bristles of the one or more brushes comes in contact with exposed conductive elements of the part in locations where insulative material is missing. The voltage and current balancing circuits provide balanced voltage responses at nominal low current levels that are detected via bristles of continuity testing brushes used to detect defects (or shorts). The voltage and current balancing provide stability, improves longevity of circuit components, and provides improved functionality allowing for use of the insulation inspection system in various applications while being human touch safe. The insulation inspection system, in addition to the stated hardware, further includes an algorithm for flagging defective parts. The algorithm improves sensitivity for better detection of defects.

The examples include an automated system having a rotary table to hold a stator and a stand to hold multiple brushes for inspecting sides of a welded end and sides of a crown end of the stator while the stator is rotated. The stator is located on the rotary table and ears and/or faces of the stator are held via brackets to the rotary table, as described below. Multiple brushes of different types are used to contact the sides of portions of the stator, such as three sides of the welded end. In an embodiment, this is done to make sure that insulative material is covering completely welds and/or naked wires of the welded end or other portion being inspected. Multiple brushes may be used to brush other portions of the stator such as wire insulation on the crown end of the stator. The brushes are designed for the bristles of the brushes to contact full crown areas and detect exposed wires in the crown. The inspection may exclude inspection of a bus bar of the stator. The brushes are designed to avoid shorts between the bristles and the stator core.

Each of the voltage and current balancing circuits improves flexibility in safety by incorporating a capacitor for voltage distribution and a pair of resistors of appropriate size. The resistances of the pairs of resistors are selected to generate low current responses. The capacitors and resistors are connected across common, negative and positive terminals of analog-to-digital (A/D) converters. The values of the resistors are selected to generate low current responses throughout operation and/or at all points of operation of the voltage and current balancing circuits. The low current responses make the test setup safe for an operator. The capacitors produce open-circuit conditions when an electrical short does not exist. When a short is detected using a brush (e.g., a brush having carbon bristles), a voltage at a positive end of a corresponding capacitor drops, which results in some drop in voltage across the corresponding resistors such that voltages of each positive and negative terminal of the corresponding A/D converter remains within a predetermined voltage range (e.g., +13V) relative to a voltage on an A/D common terminal.

The selection of the resistors is done such that the current throughout the voltage and current balancing circuits when there is a short is maintained below a predetermined current (e.g., less than or equal to 25 mA, which is not perceptible by human contact). From an incoming analog voltage signal standpoint, this would have the positive terminals of the A/D converters maintained at the nominal operating voltage (e.g., 24 V) and the negative terminals of the A/D converters maintained at 0 V when no short is present. When a break in insulation occurs, i.e., the brush to phase lead connection is shorted, the following changes occur in a corresponding one of the voltage and current balancing circuits. The corresponding positive A/D terminal is forced towards 0V. It is worth noting that the positive A/D terminal may not fully reach 0V due to intermittent contact between the brush bristles but in the case of a solid short being formed the positive A/D terminal is forced to 0V. A defect is detected when the positive A/D terminal drops to or below a predetermined threshold (e.g., 5V) or lower compared with the base or no short nominal voltage (e.g., 24V).

Since the negative A/D terminals are maintained at 0V, there is a 0V difference between the positive and negative A/D terminals of the A/D converters, and by consequence the common A/D terminals are at 0V as well. Because of this, the resistors (referred to below as resistors R2, R4, R6 . . . . RM) connected across the negative and common A/D terminals of the A/D converters experience a 0V drop (no current flow).

When defects are detected, the corresponding capacitors will have charge available to discharge as needed rather than having a power source, supplying the nominal voltage, be directly connected to the short (or defect). This allows for a constant voltage drop of each of the capacitors to be maintained while minimizing an amount of current flow in any branch of the voltage and current balancing circuits as the corresponding brushes make intermittent contact with defects. This is done by maintaining resistor-capacitor (RC) time constants sufficiently long such that discharge of the capacitors does not cause large swings in voltage drops across the capacitors over the time duration that intermittent contacts are made between the brushes and the defected areas. As an example, each of the time constants may be 24 seconds. This results in resistors (referred to below as resistors R1, R3, R5 . . . . RN) connected between i) the capacitors and ii) the positive A/D terminals and the brushes, primarily experiencing the voltage drops when short conditions occur.

To make certain that current in the circuit does not exceed something that the human body would be able to perceive, the resistors R1, R3, R5 . . . . RN are selected such that when a short exists current will not exceed a threshold (e.g., 1 milli-ampere (mA)). This voltage and current balancing operation at all points of operation is what allows the entire voltage and current balancing circuits to be safe for human touch as well as not introduce current or voltage levels that would damage either brush bristles or a part being inspected. The current and voltage levels remain below predetermined thresholds to prevent, for example, arcing.

When a short exists, the corresponding capacitor may be discharged at an appropriate rate for rapid stable measurement. Current flows through the resistors and provides an analog voltage measurement for the corresponding A/D converter. Once the brush is removed from the defect and a short circuit no longer exists, the capacitor is charged until it is back in an open-circuit state.

The voltage and current balancing circuits prevent deterioration of circuit components by preventing large swings in voltage and current across circuit components in the event of a short. The values of the capacitor and resistors are selected for improved circuit performance and to prevent circuit component deterioration due to parasitic voltages across the resistors. The values are selected to prevent drifting of circuit component values. This prevents larger than expected voltage drops and arcing across bristles of the brush.

An electrical circuit design and defect detection analysis algorithm are disclosed to enable the automated system to detect nicks and other defects in stator insulation. Multiple brushes are utilized to concurrently inspect welded and crown ends of a stator. The electrical circuit accommodates multiple brushes and tracks analog electrical responses of multiple voltage and current balancing circuits. The voltage and current balancing circuits allow for analog electrical response tracking. Multi-channel analog-to-digital conversions are performed while satisfying electrical safety parameters. Additionally, the defect detection analysis algorithm and a human machine interface display are configured to allow for concurrent defect detection, identification, and notification including flagging defects for an end user.

Figure 1:
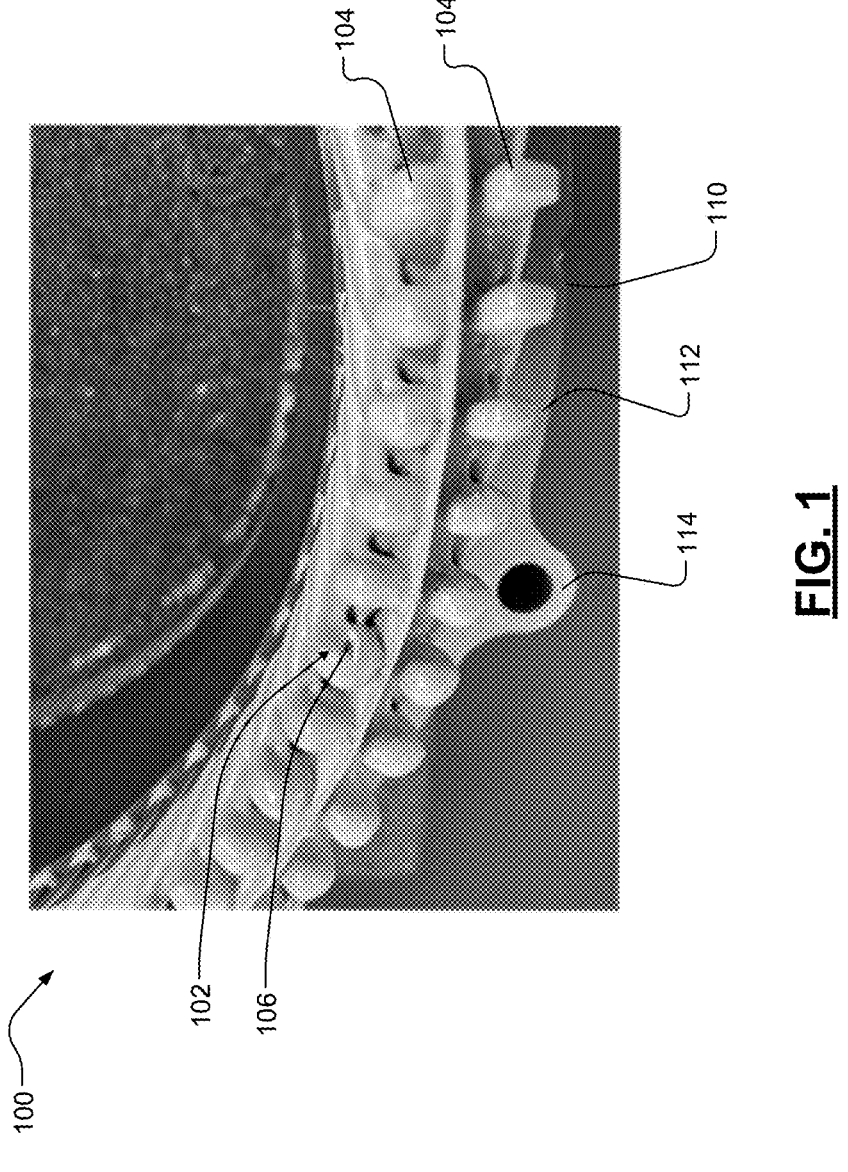
FIG. 1 is a bottom view of a portion of a stator illustrating an example defect in an insulative coating.

FIG. 1 shows a portion 100 of a stator. The stator includes welded wire pairs that are coated in insulative material. The portion 100 includes a defect 102 where a portion of the insulative coating 104 is missing and conductive material 106 of a wire is exposed. In FIG. 1, a bottom (or welded end) of the stator is shown. The stator includes a laminated stack (or body) 110 having a bottom face 112 and multiple ears (one ear 114 is shown in FIG. 1). As an example, the insulative coating 104 may be epoxy.

FIG. 2 shows an insulation inspection system 200 inspecting a stator 202. The insulation inspection system 200 includes a human machine interface (HMI) 204 and a voltage and current balancing circuit 206, which is connected to a power source 208. The HMI 204 may include a control module 210, an A/D converter 212, a memory 214, a transceiver 216, a display 218, and an audible device 220. The display 218 includes LEDs 222 and/or other visual display and/or indicator elements. The control module 210 receives digital voltage data from the A/D converter 212, which receives an analog input signal from the voltage and current balancing circuit 206. The control module 210 detects defects when the analog output signal across positive and negative terminals 223, 226 (or corresponding digital signal) of the A/D converter 212 drops in voltage below the threshold (e.g., 5V or 20% of nominal or normal expected voltage (e.g., 24V)). The normal expected voltage with no detected defect may be 24V. The control module 210 may indicate detection of defects via the display 218 and audible device 220. Detection of a defect, the change (or drop) in voltage, the timing of the detection, and/or other related information may be stored in the memory 214. As an example, the detection of the defect may be stored along with a proximate location of the defect relative to one or more reference points on the stator 202.

The display 218 provides a visual aid for indicating detection of a defect. This provides an indication also of when a defect is detected. The audible device 220 may provide a loud sound such as a loud alarm signal when a defect is detected. The audible device 220 may include, for example, a speaker. The control module 210 may report detected defects and corresponding information stored in the memory 214 to one or more network devices remotely located from the HMI 204 via the transceiver 216.

The voltage and current balancing circuit 206 includes resistors R1, R2 and a capacitor C. Resistor R1 has i) a first end connected to a first (or positive) terminal of the A/D converter 212 and to the brush 228, and ii) a second end connected to a first end of the capacitor C and to a positive terminal of the power source 208. Resistor R2 includes i) a first end connected to second (or negative) input terminal 226 of the A/D converter 212, to a second end of the capacitor, one or more of the 3-phase contacts 224, and a negative terminal of the power source 208, and ii) a second end connected to a third (or common) terminal COM of the A/D converter 212. The common terminal COM is separate from and not connected to either of the terminals 223, 226. A lead 225 is connected between i) the negative terminal 226, the first end of resistor R2 and the second end of capacitor C, and ii) the one or more 3-phase contacts 224. The first end of the capacitor C is connected to the positive terminal of the power source 208. A second end of the capacitor C is connected to the negative terminal of the power source 208.

The resistors R1, R2 and the capacitor C are connected in series between the terminal 223 and the common terminal COM. In the example shown, the capacitor C is connected between the resistors R1 and R2. In an embodiment, the resistors R1 and R2 are directly connected to the terminals 223, 226 and directly connected to the capacitor C. The resistor R1 may be directly connected to the brush 228. The resistor R2 may be directly connected to the stator 202.

As an example, the resistor R1 may be 20-30 kiloohms (kΩ), the resistor R2 may be 400-500 kΩ, and the capacitor may be 500-1500 microfarads (µF). In an embodiment, R1 is 24 kΩ, R2 is 470 kΩ, and C is 1000 µF. The resistances of the resistors and the capacitance of the capacitor are selected to provide the RC time constant referred to herein. In an embodiment, the resistances of the resistors R1, R2 are selected to limit an amount of current flowing through the stator 202, the voltage and current balancing circuit 206, and the brush 228. The resistances of the resistors R1 and R2 and the capacitance of the capacitor C are selected i) to prevent arcing and sparking at the bristles 230 when a defect (short circuit) occurs, and ii) for proper current balancing in the circuit during all test conditions to maintain being safe for human touch (less than 1 mA). For example, the resistances of the resistors R1 and R2 may be selected to prevent the current through the circuit 206, the brush 228 and the stator 202 from exceeding a predetermined threshold.

The resistance values are selected to limit current during all aspects of operation and to balance the voltage load permitted across the channels of the A/D converter 212 such as that associated with the terminals 223, 226. In an embodiment and regardless of whether a defect is present (short occurs) or no defect (no short) is present, the current is maintained between 25 microamperes (uA) and 1 mA due to i) the placement and selected values of resistors R1 and R2 along with the capacitor C in the voltage and current balancing circuit 206 in relation to the power source 208 (e.g., 24 VDC power supply), and ii) A/D voltage channel limits between different channels relative to the A/D common terminal COM. The resistances of R1 and R2 may be changed based on A/D behavior limits to maintain the current behavior described. As an example, the channel limits may be such that the A/D channels of the A/D converter are within +10-13V of the A/D common terminal COM. In an embodiment, the channel limits are such that the A/D channels are within +10.2V of the A/D common terminal COM.

The capacitance rating of the capacitor C is selected to provide a sufficiently long RC time constant in conjunction with the R1 value selected for current level reasons. This is done to provide a stable nominal voltage (e.g., stable 24V) to the voltage and current balancing circuit 208 within the time window it takes to determine if a short has occurred. The R1*C value may provide a time constant of approximately 24 seconds. This provides a sufficiently long time constant that does not need to be increased further with a larger C value, however the time constant may be increased further. If the time constant is too small then the charging and discharging behavior of the capacitor C would influence circuit operation in that the nominal voltage would no longer stay at a stable 24V when a defect occurs. This can make it challenging to assign a specific defect detection threshold since the voltage response would become convoluted with the behavior of the capacitor C.

The capacitance of the capacitor C affects a rate of change in current flowing through the stator 202, the voltage and current balancing circuit 206, and the brush 228. The capacitor C is included as a safeguard for the brush 228 and bristles 230 and prevents a surge in current from the power source 208 to the location of the short circuit. When no short circuit exists, the capacitor C is charged. When a short circuit exists, the capacitor C discharges. The capacitor C does not fully discharge due to the RC time constant used. This aids in limiting current in the circuit during a shorting event. After the discharge, the power source 208 recharges the capacitor C. Typically if the bristles are being moved, the short circuit lasts a short period of time. Without the capacitor C, the resistors R1 and R2 may deteriorate due to a short circuit and surge in current through the resistors R1 and R2. The capacitance and resistance values may also be selected based on the application of use to provide a low current draw for safe operator use. For example, the capacitance of the capacitor C and the resistances of the resistors R1, R2 may be selected to accommodate different brush head designs used for detecting defects. In an embodiment, the brush is designed to have a low impedance compared with the circuit components. The insulation inspection system 200 is able to accommodate brushes having various different designs.

The HMI 204 and/or A/D converter 212 detects an analog voltage across the terminals 223, 226. Filtering of the A/D signal is done through data sampling to remove noise associated with electrical behavior of the bristles of the brush. A voltage from the power source 208 is provided across the capacitor C, which provides a stable voltage in conjunction with resistor R1 to the brush 228 and one of the 3-phase contacts 224 of the stator 202 is connected to the lead 225. When one or more of the bristles 230, which are conductive, comes in contact with an exposed conductive element of the stator 202 current flows from one of the 3-phase contacts 224 through the stator 202 and to one or more of the bristles 230 that are in contact with the exposed conductive element. The 3-phase contacts 224 include three contacts; one for each phase of the 3-phase stator 202. In one embodiment, the 3-phase contacts 224 are connected to each other, such that current may flow through any of the phases of the stator 202. In another embodiment, the voltage is provided to one of the 3-phase contacts 224 of the stator 202 and the brush is connected to the lead 225.

Figure 3:
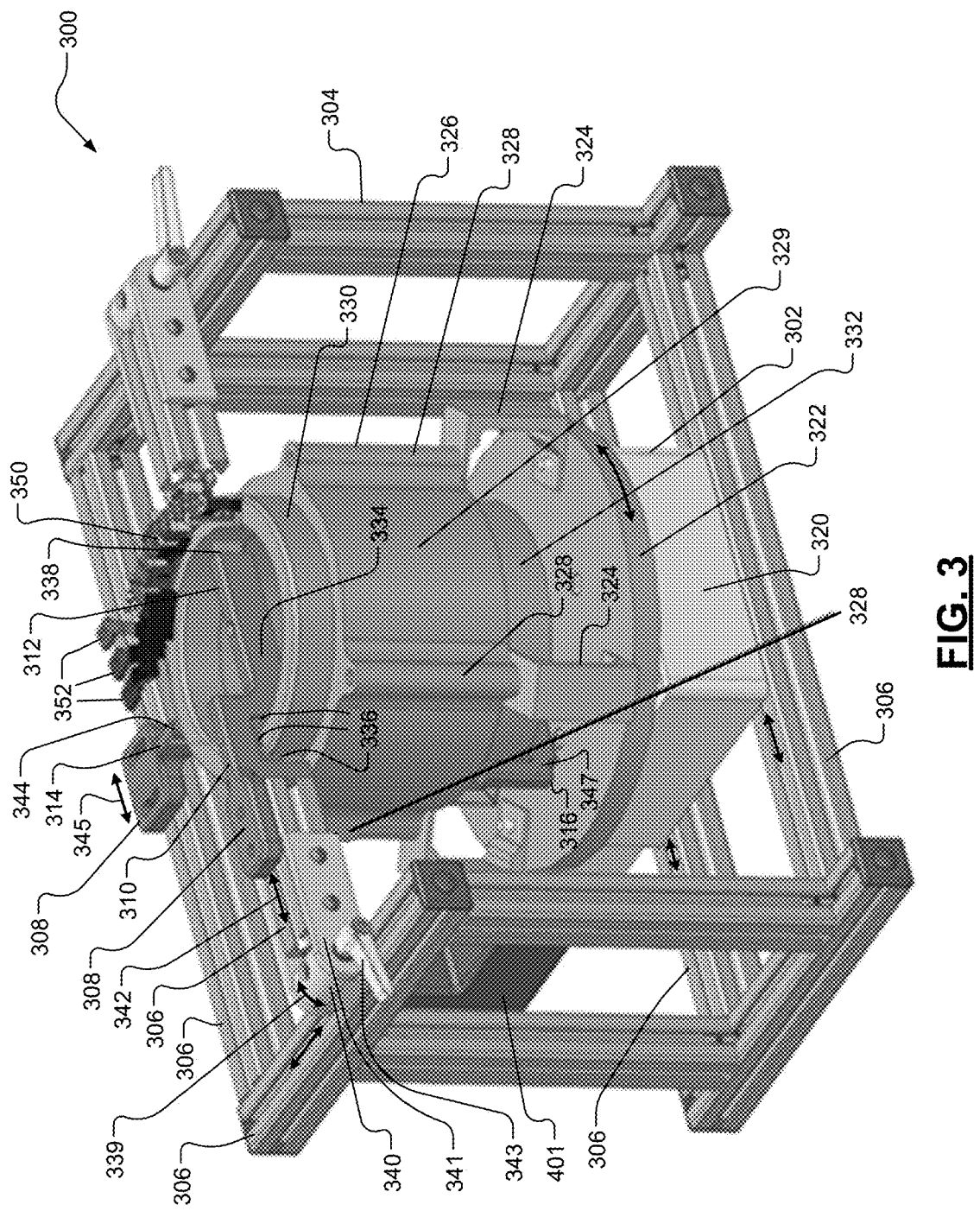
FIG. 3 is a perspective view of an example part insulation inspection stand including a part rotating table and movable and stationary brushes in accordance with the present disclosure.

The insulation inspection system 200 may be used to inspect a crown end 240 of the stator 202 as shown, a welded end 242, and/or other portion of the stator 202. The insulation inspection system 200 may also be used to inspect individual electrical components and/or elements, an example of which is shown in FIG. 3. The crown end 240 extends upward from a lamination stack 244. The welded end extends downward from the lamination stack 244. The bristles 230 may be moved along different components of the stator 202 to detect locations where insulative material is missing.

The insulation inspection system 200 includes software and hardware with tunable A/D voltage thresholds utilized for flagging defects. As an example, the threshold for flagging a defect may be set to 5V but may be different for different applications. The control module 210 implements a detection algorithm that detects when the voltage across the terminals 223, 226 drops below one of the A/D voltage thresholds and generates a visual and/or an audible signal to flag the defect detected.

The above-described voltage and current balancing circuit minimizes current levels at all points of operation independent of whether a short is present. The inclusion, selection, and arrangement of resistors and capacitor as described prevent large swings in voltage and current and thus prevent component degradation over time. This maintains current levels below thresholds associated with perceived and/or actual harm.

Figure 4:
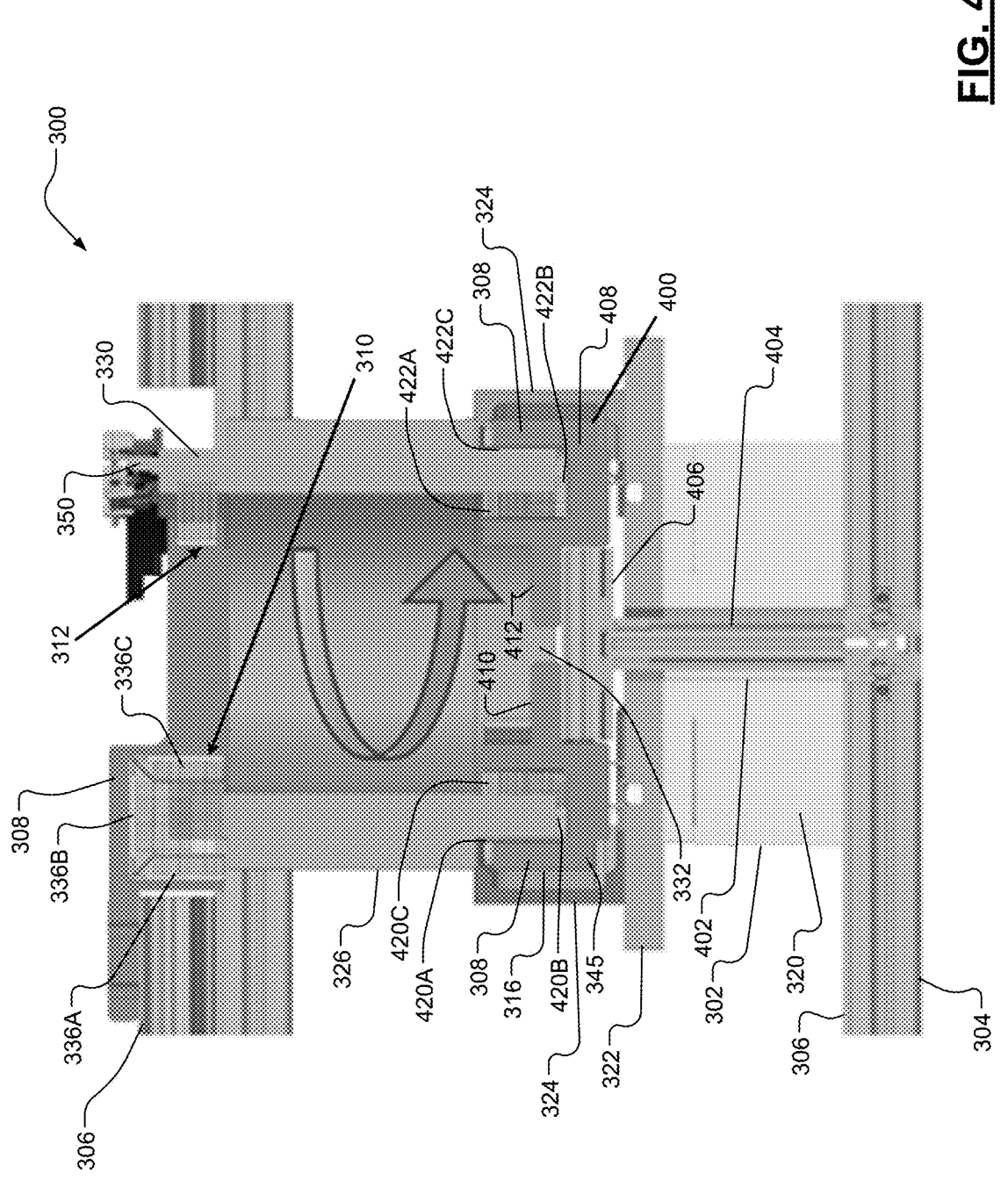
FIG. 4 is a side cross-sectional view of the part insulation inspection stand of FIG. 3.
Figure 10:
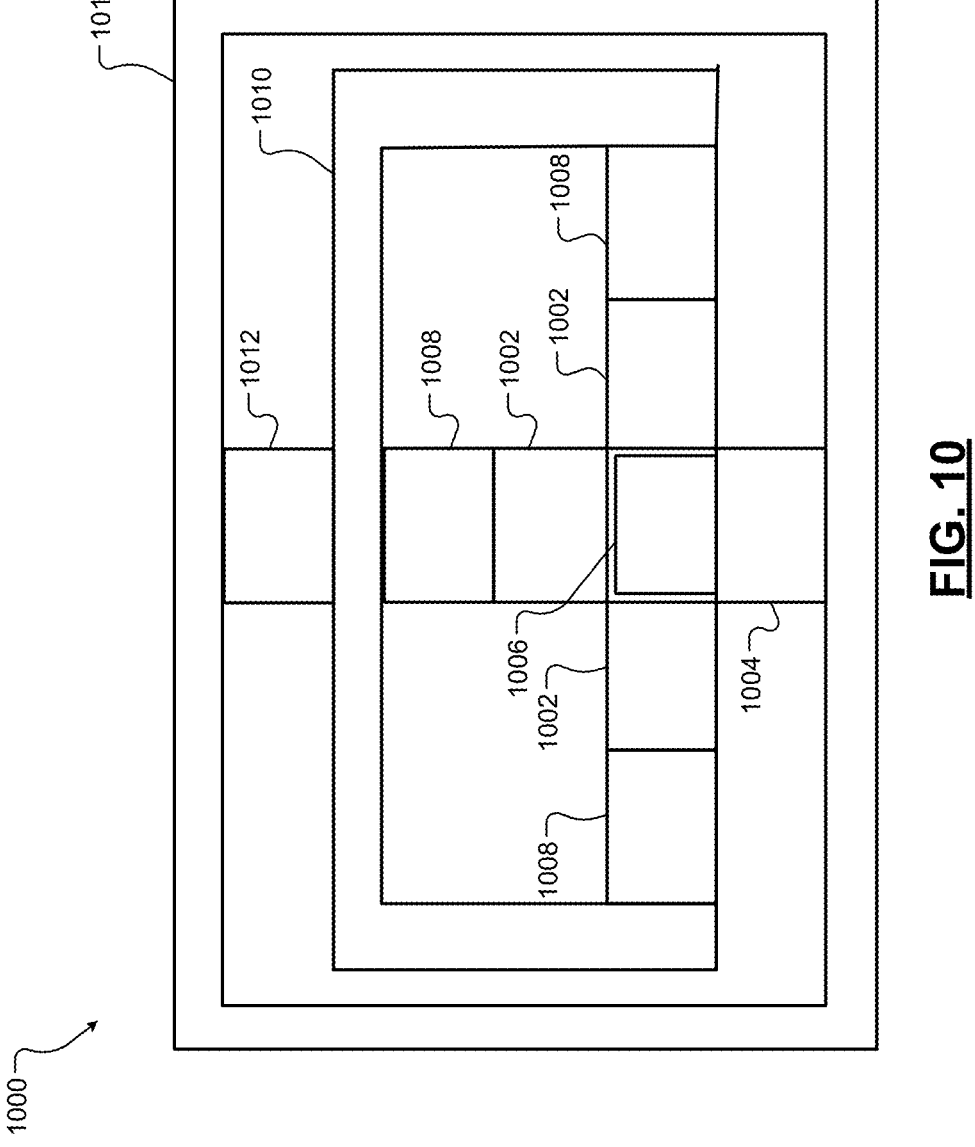
FIG. 10 is a functional block diagram of another part insulation inspection stand including moving brushes and a stationary part support in accordance with the present disclosure.

FIG. 3 shows a part insulation inspection stand 300 that includes a part rotating table assembly (may be referred to as a part support) 302, a frame 304 with rails 306, brush holding members 308, a first 'U'-shaped brush assembly 310, a first straight brush 312, a second straight brush 314, and a second 'U'-shaped brush assembly (or 'U'-shaped brush) 316. The brushes 310 and 312 in combination are referred to as a gamma brush. Although FIGS. 3-4 show a stand setup to rotate a part and to hold brushes in fixed positions, the stand may be modified to hold the part in a fixed position and to move the brushes relative to the part. An example of this is shown in FIG. 10.

The part rotating table assembly 302 of FIG. 3 includes a base 320 and a support plate 322 that rotates relative to the base 320 (or rotary table). The part rotating table assembly 302 may include part support brackets 324. The support brackets 324 are fastened to the support plate 322 and to a part 326 (e.g., a stator of a motor) being inspected. The support brackets 324 may be 'C'-shaped and fastened to ears 328 of a laminated stack 329 of the stator. The support brackets 324 may be replaced with pins with a conical end if only one side is being inspected at a time. If pins are used, then the stator would need to be flipped to test the other side of the stator. The part 326 rotates with the support plate 322.

The part rotating table assembly 302 is part of an automated system that includes the rotary table 320 with the support (or pallet) plate 322 on top. A palletize system can use at least one pallet to load the part (or stator) being inspected away from the rotary table 320 and a saddle can bring the pallet with the stator on top of the rotary table 320. The stator can also be transferred on a fixture located on the rotary table 320 (either by a robot or human). The following described brushes of the system may be activated to move to control locations ready to contact specific inspection sections of stator wires of the stator. The angular rotation of the stator is determined by the arrangement of the one or more brushes to inspect exposed insulated wires of the stator. One or more other brushes can be used by a human or robot to inspect all the exposed stator insulated wires using, for example, the system of FIG. 2.

The stator includes a crown end 330 and a welded end 332. The crown end 330 is examined using the first 'U'-shaped brush assembly 310 and the straight brushes 312, 314. The first 'U'-shaped brush assembly (or first 'U'-shaped brush) 310 includes three brushes arranged in a 'U' shape and formed as part of a Gamma brush. The gamma brush assembly also includes the three brushes and the straight brush 312. A single brush member 334 holds the bristles 336 of the three brushes and the bristles 338 of the straight brush 312. The bristles 336 brush against outer, upper, and inner sides of the crown end 330. The bristles 338 brush against an inner side of the crown end 330. The gamma brush assembly is able to be moved between being in a deployed state and being in a stowed state, as indicated by arrow 339. This may be done by loosening or tightening a clamp 340 of a swing arm 341, for example, via a handle 343. In an embodiment, the clamp 340 includes or is attached to a motor that is controlled by a control module (e.g., the control module of FIG. 7). The brush holding members 308 may be moved laterally along corresponding ones of the rails 306 as indicated by arrows 342, 345, respectively. In an embodiment, the brush holding members 308 have slots that allow the brush holding members 308 to be moved closer or further away from the stator to obtain proper contact with the stator. The brush 314 has bristles 344. The bristles 336, 338 and 344 may be held in grooves of the corresponding brush holding members (or brush holders) 308, which may have inner grooves for ends of at least some of the bristles 336, 338 and 344.

The second 'U'-shaped brush assembly 316 includes three brushes arranged in a 'U' shape and held by a single brush member 347. The three brushes of the second 'U'-shaped brush assembly 316 brush against inner, bottom, and outer sides of the welded end 332. Another 'U'-shaped brush assembly is included and is shown in FIG. 4.

The stator has a bus bar 350 with 3-phase contacts 352. The part (or stator) 326 being inspected may be rotated such that the brushes of the single brush member 334 do not come in contact with the bus bar 350. The part 326 may be rotated to inspect the stator crown section that is not covered by the bus bar 350. This is more than 180° of rotation and less than 360° of rotation. As shown, the single brush member 334 is in a 90° position relative to the part 326. With the above-stated rotated movement of the part 326, the brushes 310, 312 are able to brush 360° of the inner side surface of the crown end 330. The gamma brush assembly may be transitioned to the stowed state to allow the brush 314 to brush against 360° of the outer side of the crown end 330. The part 326 is rotated 360° to perform this operation. The second 'U'-shaped brush assembly 316 also brushes against 360° of the inner, bottom and outer surfaces of the welded end 332. Data collected for the outer side surface of the crown end 330 may be captured while capturing data for the inner, bottom and outer side surfaces of the welded end 332.

FIG. 4 shows the part insulation inspection stand 300 that includes the part rotating table assembly 302, the frame 304 with rails 306, the brush holding members 308, the first 'U'-shaped brush assembly 310, the first straight brush 312, the second 'U'-shaped brush assembly 316, and a third 'U'-shaped brush assembly (or third 'U'-shaped brush) 400. The first 'U'-shaped brush assembly 310 includes the bristles 336 including bristle sets 336A, 336B, 336C of corresponding brushes.

The part rotating table assembly 302 includes the rotary table base/housing 320 and support plate 322. The support plate 322 rotates via a shaft 402 by a motor 401 (shown in FIG. 3), which may be controlled by the control module of FIG. 7. A support rod 404 extends through the shaft 402 and connects to a support member 406, which is connected to and supports the 'U'-shaped brush assemblies 316 and 400. The 'U'-shaped brush assemblies 316 and 400 include 'U'-shaped members 345, 408 and lateral extending members 410, 412, which connect to the support member 406. The 'U'-shaped brush assemblies 316 and 400 further include bristle sets 420A, 420B, 420C and 422A, 422B, 422C. The bristles of the bristle sets 420A, 420B, 420C and 422A, 422B, 422C may include bristles of different lengths.

In the example shown, the part 326 being inspected is shown as the above referred to stator, which has the crown end 330, the welded end 332, and the bus bar 350. The part 326 is held to the support plate 322 via the support brackets 324, which are 'C'-shaped.

Figure 5:
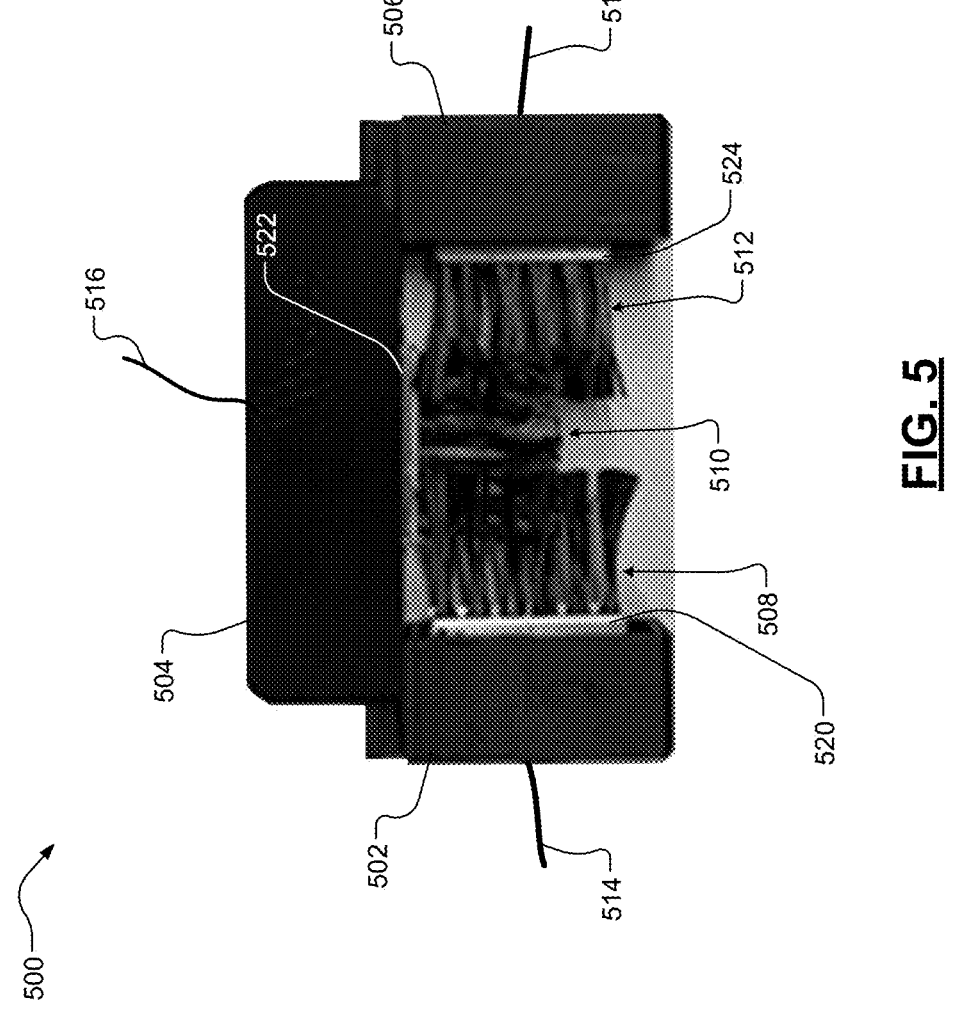
FIG. 5 is a cross-sectional view of an example 'U'-shaped brush assembly having three brushes with respective sets of bristles in accordance with the present disclosure.

FIG. 5 shows a 'U'-shaped brush assembly 500 having a holder design for three brushes 502, 504, 506 with respective bristle sets 508, 510, 512. The brushes 502, 504, 506 have respective wires 514, 516, 518, which are connected to respective voltage and current balancing circuits, examples of which are shown in FIG. 7. The bristles of the bristle sets 508, 510, 512 are conductive and flexible and held by crimps and/or bristle holding members 520, 522, 524. The brushes 502, 504, 506 have interlocking grooves that allow them to stay fixed together and connect to a lateral extending member similar to some of the brushes shown in FIG. 3.

The holder design (or holder) may be adapted for different stator models, different stator sizes of the same family, etc. The holder includes the plate 521 attached to the brush bodies, where the brush bodies have first respective channels for the wires 514, 516, 518 and second respective channels for mounting the bristle holding members 520, 522, 524. The holder may be 'U'-shaped, flat shaped, or have another shape to accommodate the detection area of exposed wires of the stator. The wires 514, 516, 518 are used to monitor voltages respectively at the brushes 502, 504, 506 in order to determine the location of a defect (or where a short circuit is detected).

Figure 6:
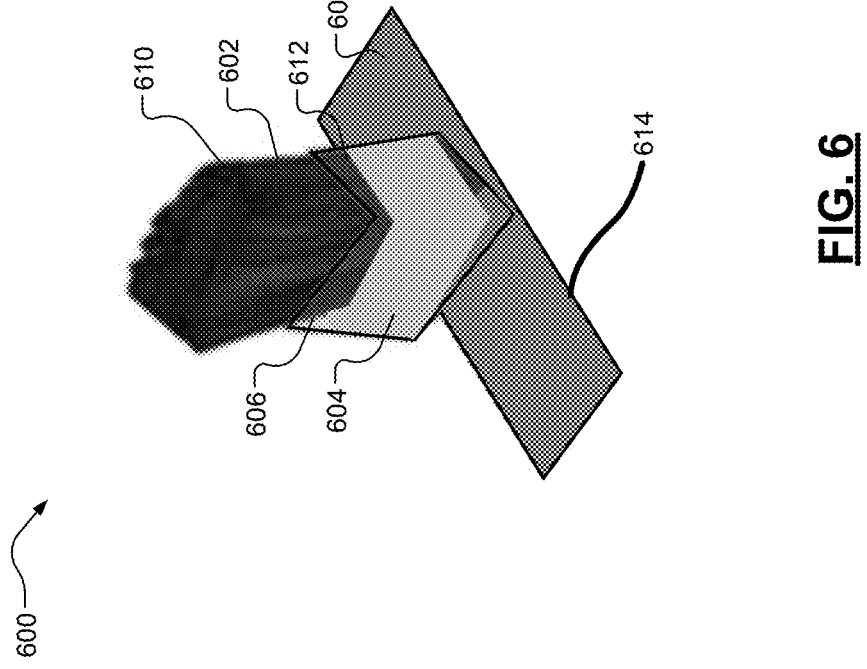
FIG. 6 is a perspective partially exploded view of an example straight brush in accordance with the present disclosure.

The bristles (or fibers) of the brushes 502, 504, 506 may be carbon fibers having an end that is embedded in epoxy to prevent the carbon fibers from "falling out" of the bristle holding members 520, 522, 524 and/or breaking. The epoxy may be conductive and may include additives to increase viscosity and/or increase electrical conductivity of the epoxy and prevent wicking (or movement of epoxy along fibers). The other additives may be zero-dimensional (0D), one-dimensional (1D), two-dimensional (2D), or three-dimensional (3D) nanomaterials and are dependent upon the additive shape and size. Both nanoparticles and micro-sized particles may be included such as metallic, non-metallic, polymeric, and non-polymeric particles. The other additives may include carbon-based nanomaterials and particles such as graphene, graphene nanoplatelet, graphite, fullerene, carbon nanotubes, carbon black, and carbon dots. The epoxy may increase the stiffness of the bristles. FIG. 6 shows an example structural arrangement of a brush, which may be used for each of the brushes 502, 504, 506.

FIG. 6 shows a straight brush 600 and corresponding bristles 602, a conductive crimp layer 604, an epoxy layer 606, and a conductive strip 608. The epoxy layer 606 is outlined and shown in a transparent form to show the conductive crimp layer 604. The bristles 602 includes first ends 610 and second ends 612. The first ends 610 are not coated and/or embedded in epoxy. The second ends 612 are coated and embedded in epoxy of the epoxy layer 606. The second ends 612 are coated in the epoxy. The epoxy may be conductive and connects the second ends 612, the conductive crimp layer 604 and the conductive strip 608. The conductive crimp layer 604 wraps around at least three sides of the second ends 612 and is crimped onto and holds the bristles 602 together. In an embodiment, the conductive crimp layer 604 wraps around four sides of the second ends 612. Although not shown in FIG. 6, the conductive strip 608 is folded over the second ends 612 and covers at least one side of the conductive crimp layer 604. The conductive strip 608 covers three sides of the second ends 612. The conductive strip 608 is connected to a wire 614, which may be an output wire used to detect a short circuit.

The bristles 602 may include carbon fibers, metallic fibers, or other conductive fibers. Density, stiffness and pull-out strength characteristics of the bristles may be selected and optimized. The conductive crimp layer 604 and conductive strip 608 may be formed of metallic materials. In an embodiment, the second ends 612, the conductive crimp layer 604, the epoxy layer 606, and the conductive strip 608 are placed, set and cured within a brush holder. Example brush holders are shown in FIG. 5.

FIG. 7 shows an insulation inspection system 700 testing a stator 702. The insulation inspection system 700 is similar to the insulation inspection system of FIG. 2 but includes a part insulation inspection assembly 704, such as the part insulation inspection stand 300 of FIGS. 3-4, and multiple voltage and current balancing circuits 706 respectively for multiple brushes 708 of the part insulation inspection assembly 704.

The insulation inspection system 700 includes a HMI 710. The HMI 710 includes a control module 711, A/D converters 712 respectively for the voltage and current balancing circuits 706, a memory 714, a transceiver 716, a display 718, and an audible device 720. The display 718 includes LEDs 722 and/or other visual display and/or indicator elements. The control module 711 receives digital voltage data from the A/D converters 712, which receive analog input signals from the voltage and current balancing circuits 706. The control module 711 detects defects when the analog output signals (or corresponding digital signals) drop in voltage below the threshold (e.g., 5V or 20% of nominal or normal expected voltage (e.g., 24V)). The control module 711 may indicate detection of defects via the display 718 and audible device 720. Detection of a defect, the change (or drop) in voltage, the timing of the detection, and/or other related information may be stored in the memory 714, as described above and as further described below.

The part insulation inspection assembly 704 includes motors 730 and brushes 732, and may also include sensors 734. The motors 730 may include a motor for rotating a support plate for a part such as the stator 702. The motors 730 may further include motors i) for moving brushes along rails and/or relative to respective portions of the part being inspected, and/or ii) for moving brushes between deployed and stowed positions. The brushes 732 may include straight brushes, 'U'-shaped brushes, and/or other brushes. Some of the brushes may be implemented in gamma brush assemblies. The sensors 734 may include motor encoders for determining positions of shafts of the motors 730, cameras for monitoring locations of the brushes 732 relative to the part being inspected, speed sensors for monitoring a speed of one or more of the motors 730, and/or other sensors.

The stator 702 includes a crown end 740, a laminated stack 742, and a welded end 744. The crown end 740 extends from a top face 746 of the laminated stack 742. The welded end 744 extends from a bottom face 748 of the laminated stack 742. The stator 702 has three phases with respective 3-phase contacts 750.

Each of the voltage and current balancing circuits 706 includes i) a pair of resistors R1 and R2, R3 and R4, . . . or RM and RN, and ii) a respective one of the capacitors C1-CP, where M, N, and P are integers. The number of resistor pairs equals the number of capacitors.

Each of the resistors R1, R3, . . . , RM has i) a first end connected to a first (or positive) terminal of a respective one of the A/D converters 712 and to a respective one of the brushes 732, and ii) a second end connected to a respective one of the capacitors C1-CP and to a positive terminal of the power source 760. The first ends of the capacitors C1-CP are connected to the resistors R1, R3, . . . , RM and are connected to the positive terminal of the power source 760. Second ends of the capacitors C1-CP are connected to a negative terminal of the power source 760, to a respective one of the resistors R2, R4, . . . , RN, to a second (or negative) terminal of a respective one of the A/D converters 712, and to one or more of the 3-phase contactors 750.

Each of the resistors R2, R4, . . . , RN includes i) a first end connected to a third (or common) terminal of a respective one of the A/D converters 712, and ii) a second end connected to the second end of a respective one of the capacitors C1-CP, to the negative terminal of the power source 760, and to one or more of the 3-phase contacts 750 of the stator 702. A lead 725 is connected between i) the negative terminals of the A/D converters 712, the second ends of resistors R2, R4, . . . , RN and the second ends of the capacitors C1-CP, and ii) the one or more 3-phase contacts 750.

The resistors and the capacitor of each of the voltage and current balancing circuits 706 are connected in series between the positive terminals of the A/D converters 712 and the common terminals of the A/D converters 712. In the example shown, each of the capacitors C1-CP is connected between a respective one of the resistors R1, R3, . . . , RM and a respective one of the resistors R2, R4, . . . , RN. In an embodiment, the resistors R1, R3, . . . , RM and R2, R4, . . . , RN are directly connected to a respective one of the terminals of the A/D converters 712 and directly connected to the corresponding one of the capacitors C1-CP. The resistors R2, R4, . . . , RN may be directly connected to the stator 702. The resistors R1, R3, . . . , RM may be directly connected to the brushes 732.

As an example, the resistors R1, R3, . . . , RM may each be 20-30 kiloohms (kΩ), the resistors R2, R4, . . . , RN may each be 400-500 kΩ, and the capacitors may each be 500-1500 microfarads (µF). In an embodiment, the resistors R1, R3, . . . , RM are each 24 kΩ, the resistors R2, R4, . . . , RN are each 470 kΩ, and the capacitors C1-CP are each 1000 µF.

The resistances of the resistors R1, R3, . . . , RM, R2, R4, . . . , RN and the capacitance of the capacitors C1-CP are selected to provide the RC time constants referred to herein. In an embodiment, the resistances are selected to limit an amount of current flowing through the stator 702, the voltage and current balancing circuits 706, and the brushes 1-N. The resistances and the capacitances are selected i) to prevent arcing and sparking at the bristles of the brushes 1-N when a defect (short circuit) occurs, and ii) for proper current balancing in the circuit during all test conditions to maintain being safe for human touch (less than 1 mA). For example, the resistances may be selected to prevent the current through the circuit 700, the brushes 1-N and the stator 702 from exceeding a predetermined threshold.

The resistance values are selected to limit current during all aspects of operation and to balance the voltage load permitted across the channels of the A/D converters 712 such as that associated with the positive and negative terminals of the A/D converters 712. In an embodiment and regardless of whether a defect is present (short occurs) or no defect (no short) is present, the current is maintained between 25 microamperes (uA) and 1 mA due to i) the placement and selected values of resistors along with the capacitors in the voltage and current balancing circuits 706 in relation to the power source 760 (e.g., 24 VDC power supply), and ii) A/D voltage channel limits between different channels relative to the A/D common terminal COM. The resistances may be changed based on A/D behavior limits to maintain the current behavior described. As an example, the channel limits may be such that the A/D channels of the A/D converters 712 are within +10-13V of the A/D common terminal COM. In an embodiment, the channel limits are such that the A/D channels are within +10.2V of the A/D common terminal COM.

The capacitance ratings of the capacitors are selected to provide sufficiently long RC time constants in conjunction with the resistances of the resistors R1, R3, . . . , RM selected for current level reasons. This is done to provide a stable nominal voltage (e.g., stable 24V) to the voltage and current balancing circuits 706 within the time window it takes to determine if a short has occurred. The RC values may provide time constants of approximately 24 seconds. This provides sufficiently long time constants that do not need to be increased further with larger C values, however the time constants may be increased further. If the time constants are too small then the charging and discharging behavior of the capacitors C1-CP would influence circuit operation in that the nominal voltage would no longer stay at a stable 24V when a defect occurs. This can make it challenging to assign a specific defect detection threshold since the voltage response would become convoluted with the behavior of the capacitors C1-CP.

In an embodiment, the resistances of the resistors R1, R3, . . . , RM and R2, R4, . . . , RN are selected to limit an amount of current flowing through the stator 702, the voltage and current balancing circuits 706, and the brushes 732. The resistances of the resistors R1, R3, . . . , RM and R2, R4, . . . , RN and the capacitances of the capacitors C1-CP are selected to prevent arcing and sparking at the bristles of the brushes 732 when defects (short circuits) occur. For example, the resistances of the resistors R1, R3, . . . , RM and R2, R4, . . . , RN may be selected to prevent the current through each of the brushes 732 from exceeding a predetermined threshold.

The voltage and current balancing circuits 706 operate similarly as the voltage and current balancing circuit 206 of FIG. 2. The brushes 732 may include the brushes 310, 312, 314, 316, 400 of FIGS. 3-4. The control module 711 monitors for defects detected via the voltage and current balancing circuits 706, the A/D converters 712, and the brushes 732.

Figure 8:
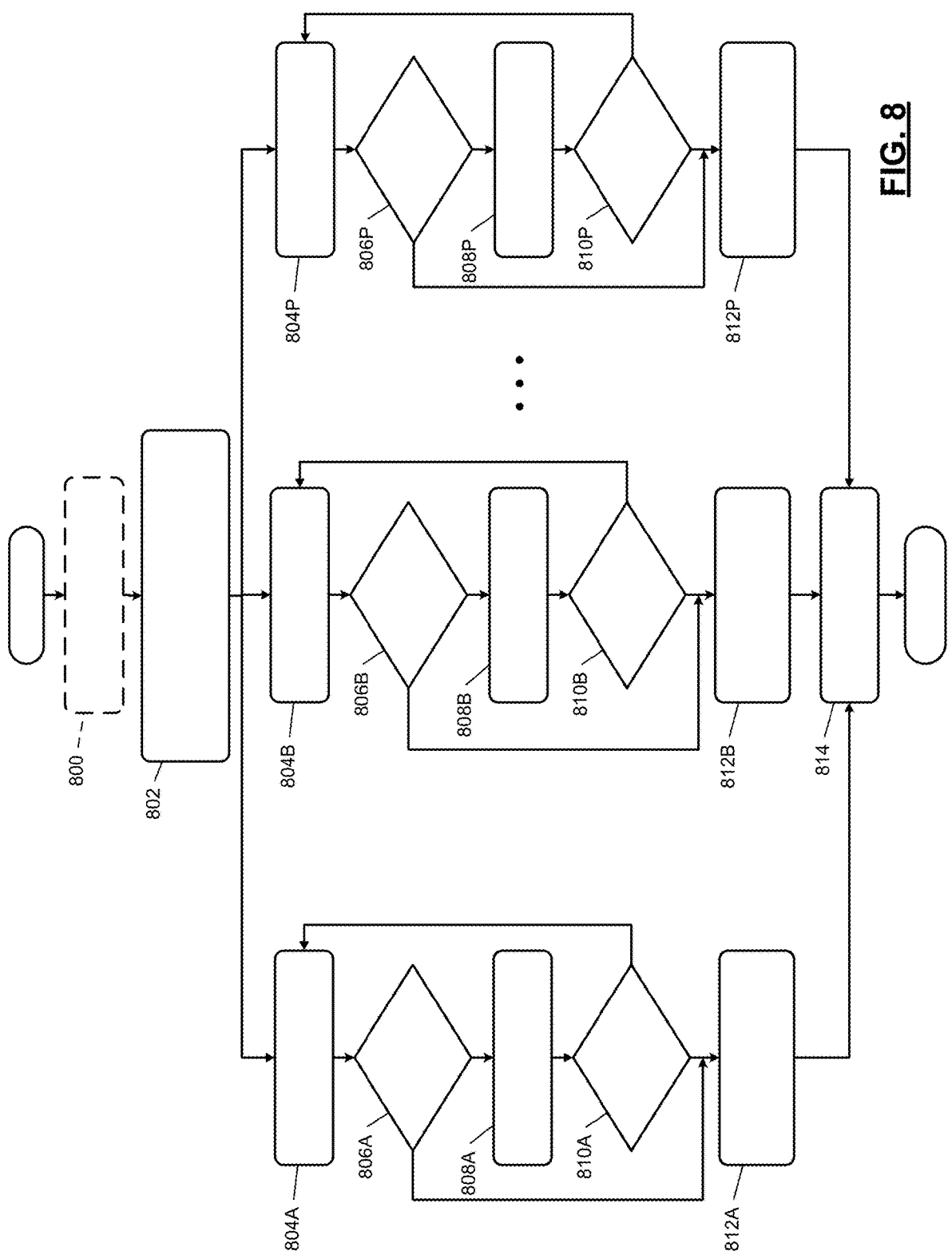
FIG. 8 illustrates an example insulation inspection method for detecting, marking, identifying and reporting defects in accordance with the present disclosure.

FIG. 8 illustrates an example insulation inspection method for detecting, marking, identifying and reporting defects via multiple brushes (e.g., the brushes of FIGS. 3-4 and 7). The insulation inspection method implements a defect detection analysis algorithm including the following operations. The operations may be iteratively performed. Operations that are shown with solid lined boxes may be performed by the insulation inspection system 200 of FIG. 2 and/or the insulation inspection system 700 of FIG. 7 utilizing the part insulation inspection stand 300 of FIGS. 3-4 or another stand similar to that of the part insulation inspection stand 300. Although the operations are primarily described with respect to the insulation inspection system 700 of FIG. 7, the operations are applicable to other embodiments of the present disclosure.

At 800, the lead 725 is connected to the part being inspected such as the stator 702 or other electrical component. For example, the lead 725 may be connected to one or more of the 3-phase contacts 750.

At 802, the control module 711 begins rotating the part according to a move profile while passing brushes over insulated sections of the part. The part may be rotated in increments or in a continuous motion. The part may be rotated while performing the following operations. The brushes 732 are moved over insulated section of the part being inspected. This includes brushing the bristles of the brushes 732 on the insulated sections such that one or more of the bristles comes in contact with any uninsulated (exposed) conductive material of the part. The exposed conductive material being at a voltage applied by the power source 760 to the part. When one or more of the bristles contacts an exposed portion of the part a short is created and the control module 711 detects the drop in voltage. The short circuit produces a sharp voltage drop below the threshold level from the nominal (or normal expected) level. The bristles maintain contact with the part while being moved relative to the part.

At 804A, 804B, . . . , 804P (collectively referred to as operation 804), the control module 210 begins monitoring voltage at the input terminals of the A/D converters 712 and thus at bristles of the brushes 732. This may include determining a location of the bristles of the brushes 732 relative to one or more reference points of the part being inspected. In an embodiment, the bristles of the brushes 732 initially contact respective locations on the part for which the control module knows the coordinates and then the brushes 732 are moved. As an example, the movement including location and speed information, may be tracked by the control module 711 based on outputs of the sensors 734.

At 806A, 806B, . . . , 806P (collectively referred to as operation 806), the control module 811 determines whether a defect has been detected. If one or more defects have been detected, operation 808A, 808B, . . . , 808P (collectively referred to as operation 808) is performed for the brush(es) at which a defect is detected, otherwise operation 812A, 812B, . . . , 812P may be performed for the brush(es) for which a defect is not detected. A defect is detected when there is a short between one or more of the bristles of one or more of the brushes 732 and one or more exposed conductive elements of the part. When the part is a stator, a short may exist between one or more of the bristles and one or more exposed wires of the stator and thus between the one or more bristles and one or more of the 3-phase contacts 750 of the stator 702.

Figure 9:
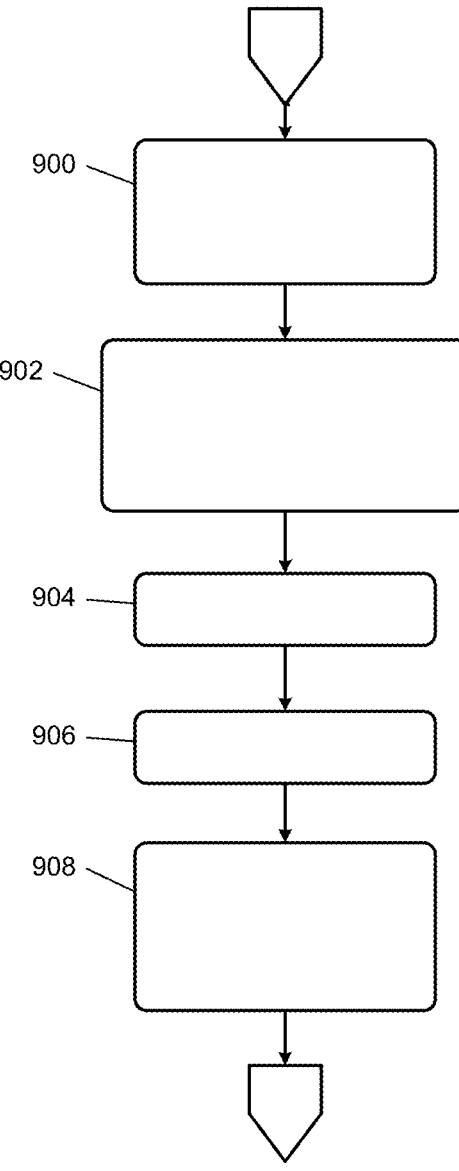
FIG. 9 illustrates an example defect indicating procedure in accordance with the present disclosure.

At 808A, 808B, . . . , 808P (collectively referred to as operation 808), the control module performs a defect indicating procedure, which is illustrated in FIG. 9.

At 900, the control module indicates the defects detected visually and/or audibly via one or more indicators, such as via the display 718, the LEDs 722, and/or the audible device 720. In an embodiment, a message is displayed via the display 718. The message may include information regarding the detected defects including the location of the defects, time when defects are detected, drops in voltages at A/D converters 712 experienced as a result of defects, rates of the drops in voltages, how long the defects are detected, etc. In another embodiment, the message is sent from the HMI 710 to another network device via the transceiver 716. The defects may be detected for short periods depending on the size of the defect and the speed of movement of the corresponding brushes relative to the part being inspected. The location of the defect may be indicated relative to the one or more reference points on the part being inspected.

As an example, a ring may be attached to the welded end 744 and have clocked indices and/or the lamination stack 742 may have reference points. The indices and/or reference points may be used to determine locations of the defects detected. In an embodiment, the control module 711 flags the defects by illuminating red LEDs (one for each defect) or displaying red icons (one for each defect). Green LEDs may be on and/or green icons may be displayed for brushes that are not detecting defects. The display may include a LED and/or display an icon for each brush indicating whether a defect has been detected or not using that brush. In another embodiment, the control module 711 flags the defects by initiating an audible defect alarm signal.

At 902, the control module 711 records the information regarding the detected defects. At 904, the brushes 732 are removed from the part (i.e., moved to stowed positions away from the part). At 906, the voltage of the voltage and current balancing circuits 706 return to nominal levels.

At 908, the control module 711 stops indicating that a defect has been detected and returns the one or more indicators back to normal states. For example, the audible device 720, which may be providing the audible message (or alarm), turns off. The illuminated LEDs turn green or off. The displayed icons that are indicating a defect exists change from being red to being green or are no longer displayed. Operation 810A, 810B, . . . , 810P (collectively referred to as operation 810) of FIG. 8 may be performed subsequent to operation 908.

At 810, the control module 711 may determine if there is more of the part to inspect. If yes, operation 804 may be performed, otherwise the method may end.

At 812, the control module 711 may compile the defect information for each of the detected defects including the locations of the defects and the other related information. The compiled information may be stored as a compiled information file in the memory 714.

At 814, the control module 711 may report the compiled information in an overall compiled defect presence report and/or portions thereof via the display 718 and/or the audible device 720. The report and/or compiled information may be transmitted to a remote network device via the transceiver 716. This information may include locations of defects, identify one or more defective zones where defects are located, and/or other related information (e.g., any of the information stated above). This may include an indication of the location of the defects on the part, the times the defects were detected, and/or other information indicative of the locations of the defects.

Based on the detected defects and corresponding information, the defects may then be inspected and repaired. The control module 711 may rotate the part to allow for manual inspection and/or for repair of a defect. If a defect is beyond repair and/or if there are too many defects, the part may be recycled or discarded. The control module 711 may indicate based on the collected information whether the part is repairable and/or whether the part should be recycled or discarded.

FIG. 10 shows a part insulation inspection stand 1000 that includes moving brushes 1002 and a stationary part support 1004, which is holding a part 1006 in a fixed position. Any number of brushes may be included. The brushes may be of any of the types referred to above. FIG. 10 is provided as an example and shows one example arrangement of brushes relative to a part, the brushes may be in various other arrangements relative to the part. The part 1006 may be a stator or other type of part. The brushes 1002 may be held by brush holders 1008, which may be mounted to one or more support members. One example support member 1010 is shown. One or more motors may be included to move the one or more support members and thus the brushes 1002. The motors may be mounted on a frame 1011. One motor 1012 is shown and moves the support member 1010. The motors move the brushes 1002 relative to the part. This movement may be a rotary movement or a linear movement. Motors may be included to move the brushes between deployed and stowed states. The brushes 1002 may be connected to voltage and current balancing circuits of an insulation inspection system, as shown in FIG. 7. The part support 1004 may also be mounted to the frame 1011.

The example automated system disclosed herein detects nicks on exposed wires at the welded and crown ends of an assembled stator. Brush holders are adjustable to handle different stator sizes of the same family and different brush head types and designs. This brings a high degree of flexibility in meeting a given application's requirements. The automated system may be configured with stationary brushes and rotate a stator relative to the brushes or may be configured with a stationary stator support member and rotate (or move) brushes relative to the stator.

Brushes are configured to detect exposed wires at the welded and crown ends. Brush holders are optimized for each specific stator size and design. In an embodiment, the ends of carbon fibers are embedded within an epoxy and inserted in grooves of brush holders. Additives can be utilized (such as carbon black) to increase the viscosity of the epoxy to prevent pull-out of the bristles, to provide low consistent interface resistance, and to prevent wicking. The bristle lengths of 'U'-shaped conductive brushes are selected for each application of use and to avoid significant overlap of bristles i) at curvature (or 90° angled) sections of 'U'-shaped holders to allow the bristles to properly deflect, and ii) at contact sections (or contact ends) where the bristles contact the part being inspected.

The above-described examples include a circuit design for multi-channel analog-to-digital conversion of brush signals while satisfying electrical safety parameters for operators. The circuit design allows for concurrent analog signal tracking for each brush integrated in the automated system. The multi-channel circuit design may include multiple brushes to fully inspect (perform electrical testing of) each insulated portion of a part.

An analysis algorithm is provided that monitors the digitally converted signals from each brush individually while tracking the movement profile of either the brushes or the part being inspected as the brushes or part are moved (e.g., rotated) relative to each other for both defect identification and location determination. A HMI display is used for concurrent defect detection and notification (e.g., flagging). In an embodiment, locations of detected defects are reported to an end user and/or remote network device when a repeatable move profile is utilized for inspection.

The inspection circuit and the analysis algorithm disclosed herein enable the automated system to inspect for cuts, nicks and other defects in insulation of wires at both ends of a stator assembly. The inspection circuit has improved circuit performance to avoid deterioration of electrical circuit components due to parasitic voltage across resistances of the inspection circuit. The analysis algorithm is used to monitor the digitally converted signals from each brush individually while tracking movement profiles of the brushes and/or part being inspected as they are moved relative to each other for both defect identification and approximate location. A HMI display is updated for an end user to allow for simultaneous brush detection and notification for flagging defects. The HMI display may be utilized as visual aid in knowing when and where a defect occurs. If there is a short the corresponding defect may be shown via the HMI on a screen and/or with an audible alarm.

Flexibility in safety is improved by incorporating capacitors at each analog-to-digital channel for voltage distribution within the circuit. Resistors having selected resistances are included to generate low current responses making a test setup safe for an operator and prevent electrical arcing between brush bristles and the part being inspected. Capacitors produce open-circuit conditions when short (short circuit conditions) do not exist. When a short (or short circuit condition) is detected by a brush, a voltage at a positive end of the corresponding capacitor drops, which results in some drop in voltage across the corresponding pair of resistors such that voltages of each positive and negative terminal of the corresponding A/D converter remains within a predetermined voltage range (e.g., +13V) relative to a voltage on the A/D common terminal. Once the brush is removed from the location of the short, the capacitor is charged until it is back in its open-circuit state. The drop in voltage is and the amount of current flow through the circuit due to the short are limited. This helps prevent deterioration of the circuit and makes the circuit safe for human contact. Capacitor and resistor values are set to satisfy application needs while providing a low current draw for safe operator use.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. An insulation inspection system comprising:
   a support for a part being inspected, wherein the part comprises insulative portions and a conductive element, and wherein the conductive element is covered by insulative material of one of the insulative portions;
   a plurality of brushes comprising respective sets of conductive bristles, wherein the sets of conductive bristles brush against respective insulated portions of the part;
   at least one motor configured to move at least one of i) the part relative to the plurality of brushes, and ii) one or more of the plurality of brushes relative to the part; and
   a control module configured to i) control the at least one motor to follow a movement profile, and ii) during the movement of at least one of the part and the one or more of the plurality of brushes, detect a change in at least one of a voltage and a current of the one or more of the conductive bristles, and based on the detected change, detect a defect in the insulative material of the one of the insulated portions of the part due to a short circuit between a) one or more of the conductive bristles of the plurality of brushes and b) the conductive element of the part, which is exposed in a location of the defect.

2. The insulation inspection system of claim 1, further comprising a frame, wherein:
the support for the part is mounted on the frame; and
the at least one motor is directly or indirectly mounted on the frame.

3. The insulation inspection system of claim 2, wherein the support for the part is implemented as a rotary support plate configured to rotate the part relative to the plurality of brushes.

4. The insulation inspection system of claim 2, wherein:
the frame comprises a plurality of rails;
the plurality of brushes are mounted on the plurality of rails via a plurality of brush holders; and
the plurality of brush holders are moveable relative to the plurality of rails.

5. The insulation inspection system of claim 4, wherein the at least one motor is configured to move at least one of the brush holders along at least one of the plurality of rails.

6. The insulation inspection system of claim 4, wherein:
the plurality of rails comprise a first rail and a second rail;
the first rail is mounted to a clamp and supports at least one of the plurality of brushes;
the clamp is mounted to and slidable along the second rail; and
a portion of the clamp is rotatable relative to the second rail to transition the at least one of the plurality of brushes between a stowed state and a deployed state.

7. The insulation inspection system of claim 1, wherein:
the at least one motor is configured to move at least one of the plurality of brushes between a deployed state and a stowed state; and
the at least one of the plurality of brushes contacting the part when in the deployed state and not contacting the part when in the stowed state.

8. The insulation inspection system of claim 1, wherein the plurality of brushes comprises at least one straight brush, at least one gamma brush, and at least one 'U'-shaped brush.

9. The insulation inspection system of claim 1, wherein:
the part is a stator; and
the plurality of brushes are configured to brush multiple sides of a crown end and a welded end of the stator.

10. The insulation inspection system of claim 1, wherein the control module is configured to rotate the part via the at least one motor while not interfering with a bus bar of the part.

11. The insulation inspection system of claim 1, wherein the at least one motor is configured to move the part relative to the plurality of brushes.

12. The insulation inspection system of claim 1, wherein the at least one motor is configured to move one or more of the plurality of brushes relative to the part.

13. The insulation inspection system of claim 1, wherein:
the conductive bristles of at least one of the plurality of brushes comprise an end embedded in epoxy and held together by a conductive crimp layer;
the end of the conductive bristles are connected to a wire via a conductive strip that is folded over the conductive crimp layer;
the wire provides a signal to the control module; and the control module is configured to determine whether the defect exists with the part based on the signal.

14. The insulation inspection system of claim 13, wherein the epoxy comprises at least one additive for at least one of increased viscosity and increased conductivity.

15. The insulation inspection system of claim 1, further comprising a frame, wherein the plurality of brushes are mounted on and movable relative to the frame to accommodate for different sized parts being inspected.

16. The insulation inspection system of claim 1, wherein the plurality of brushes include a 'U'-shaped brush comprising:
a first brush brushing a first side of a portion of the part;
a second brush brushing a second side of the portion of the part;
a third brush brushing a third side of the portion of the part;
a first brush holder holding the first brush;
a second brush holder holding the second brush; and
a third brush holder holding the third brush, the first brush holder, the second brush holder, and the third brush holder are connected to each other.

17. An insulation inspection system comprising:
a frame;
a rotary support table configured to support and rotate a part being inspected, wherein the part comprises insulative portions and a conductive element, and wherein the conductive element is covered by insulative material of one of the insulative portions;
a plurality of brushes comprising respective sets of conductive bristles, wherein the sets of conductive bristles brush against respective insulated portions of the part;
a plurality of motors; and
a control module configured to i) control the plurality of motors to rotate the part and to move at least one of the plurality of brushes relative to the part, and ii) during rotation of the part, detect a change in at least one of a voltage and a current of the one or more of the conductive bristles, and based on the detected change, detect a defect in the insulative material of the one of the insulated portions of the part due to a short circuit between a) one or more of the conductive bristles of the plurality of brushes and b) the conductive element of the part, which is exposed in a location of the defect.

18. The insulation inspection system of claim 17, wherein the plurality of brushes comprise straight brushes and 'U'-shaped brushes.

19. The insulation inspection system of claim 17, wherein:
the plurality of brushes are configured to brush a plurality of sides of a first portion of the part and a plurality of sides of a second portion of the part; and
the second portion being different than the first portion.

20. The insulation inspection system of claim 1, wherein:
the part is a stator of a motor;
the conductive element is a wire of the stator;
the insulated portions of the part refer to areas of insulation covering the stator; and
the insulative material of the part refers to the material of the insulated portions of the part.

\* \* \* \* \*